(12) United States Patent
Bosnyak et al.

(10) Patent No.: US 7,217,915 B2
(45) Date of Patent: May 15, 2007

(54) METHOD AND APPARATUS FOR DETECTING THE POSITION OF LIGHT WHICH IS INCIDENT TO A SEMICONDUCTOR DIE

(75) Inventors: Robert J. Bosnyak, Tacoma, WA (US); Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 227 days.

(21) Appl. No.: 10/840,865

(22) Filed: May 7, 2004

(65) Prior Publication Data

US 2005/0247861 A1 Nov. 10, 2005

(51) Int. Cl.
*H01L 31/00* (2006.01)
*H01L 27/00* (2006.01)

(52) U.S. Cl. .............................. 250/214.1; 250/214 R; 250/208.1; 250/214 SW

(58) Field of Classification Search ............ 250/214 R, 250/214 SW, 548, 214.1; 356/153, 139.04; 398/156, 129, 131
See application file for complete search history.

(56) References Cited

U.S. PATENT DOCUMENTS

| | | | |
|---|---|---|---|
| 4,268,843 A | 5/1981 | Brown et al. ................. 357/19 |
| 4,390,790 A | 6/1983 | Rodriguez ................... 250/551 |
| 4,755,697 A | 7/1988 | Kinzer ....................... 307/570 |
| 5,012,084 A * | 4/1991 | Guiberteau et al. ...... 250/214.1 |
| 5,629,838 A | 5/1997 | Knight et al. ............... 361/782 |
| 6,323,475 B1 * | 11/2001 | Spartiotis et al. ......... 250/208.1 |
| 6,728,113 B1 | 4/2004 | Knight et al. ............... 361/760 |
| 6,763,597 B2 * | 7/2004 | Lysen .......................... 33/286 |
| 6,777,662 B2 * | 8/2004 | Drowley et al. ......... 250/208.1 |
| 6,916,719 B1 | 7/2005 | Knight et al. ............... 438/381 |
| 6,982,406 B2 * | 1/2006 | Chen ....................... 250/214.1 |

* cited by examiner

*Primary Examiner*—Stephone B. Allen
*Assistant Examiner*—Davienne Monbleau
(74) *Attorney, Agent, or Firm*—Park, Vaughan & Fleming LLP

(57) ABSTRACT

One embodiment of the present invention provides a system for detecting light which is incident to a first semiconductor die. During operation, the system receives light at a photo-detector on the first semiconductor die, wherein associated circuitry converts the received light into a current. In doing so, the associated circuitry biases a gate voltage of an integrating transistor to be close to a threshold voltage of the integrating transistor, and applies the current from the photo-detector to the gate of the integrating transistor so that the current causes a charge to collect at the gate of the integrating transistor. This charge builds up and causes the integrating transistor to switch, thereby indicating that light has been received by the photo-detector.

12 Claims, 4 Drawing Sheets

METHOD AND APPARATUS FOR DETECTING THE POSITION OF LIGHT WHICH IS INCIDENT TO A SEMICONDUCTOR DIE

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to integrated circuit devices. More specifically, the present invention relates to a method and an apparatus for detecting position using beams of light between semiconductor dies.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem has created a bottleneck that continues to grow as semiconductor integration densities continue to increase.

Researchers have begun to investigate alternative techniques for communicating between semiconductor chips. Proximity Communication is one such alternative technique that communicates using the coupling capacitances between face-to-face chips. The Proximity Communication technique requires good mechanical alignment between chips, and hence requires a method to measure the position between chips. One promising technique involves using light energy to convey position between semiconductor chips. However, it is not a simple matter to build a photo-detector on a semiconductor die with sufficient sensitivity to detect the position of an incident beam of light.

Hence, what is needed is a method and an apparatus for building a photo-detector on a semiconductor die with sufficient sensitivity to detect the position of an incident beam of light.

SUMMARY

One embodiment of the present invention provides a system for detecting light which is incident to a first semiconductor die. During operation, the system receives light at a photo-detector on the first semiconductor die, wherein associated circuitry converts the received light into a current. In doing so, the associated circuitry biases a gate voltage of an integrating transistor to be close to a threshold voltage of the integrating transistor, and applies the current from the photo-detector to the gate of the integrating transistor so that the current causes a charge to collect at the gate of the integrating transistor. This charge builds up and causes the integrating transistor to switch, thereby indicating that light has been received by the photo-detector.

In a variation on this embodiment, the system receives light at a second photo-detector on the first semiconductor die, wherein the second photo-detector is part of an array of photo-detectors on the first semiconductor die. The system then applies the current from the second photo-detector to a corresponding integrating transistor in a corresponding array of integrating transistors.

In a further variation, the integrating transistor causes a detector output to switch. Furthermore, the system stores the detector outputs from the array of integrating transistors into an output register, wherein the output register indicates which photo-detectors in the array of photo-detectors received light.

In a further variation, the system generates the light from a light source on a second semiconductor die which is located in close proximity to the first semiconductor die, so that the light is received at the photo-detector on the first semiconductor die.

In a further variation, the system determines an alignment of the first semiconductor die relative to the second semiconductor die based upon which photo-detectors in the array of photo-detectors received the light.

In a variation on this embodiment, the photo-detector can include a photo-diode or a P/N-junction photo-detector.

In a variation on this embodiment, the light is generated by one of a Zener diode, a light emitting diode (LED), a vertical cavity surface emitting laser (VCSEL), and an avalanche breakdown P/N diode.

DETAILED DESCRIPTION

Figure 1:
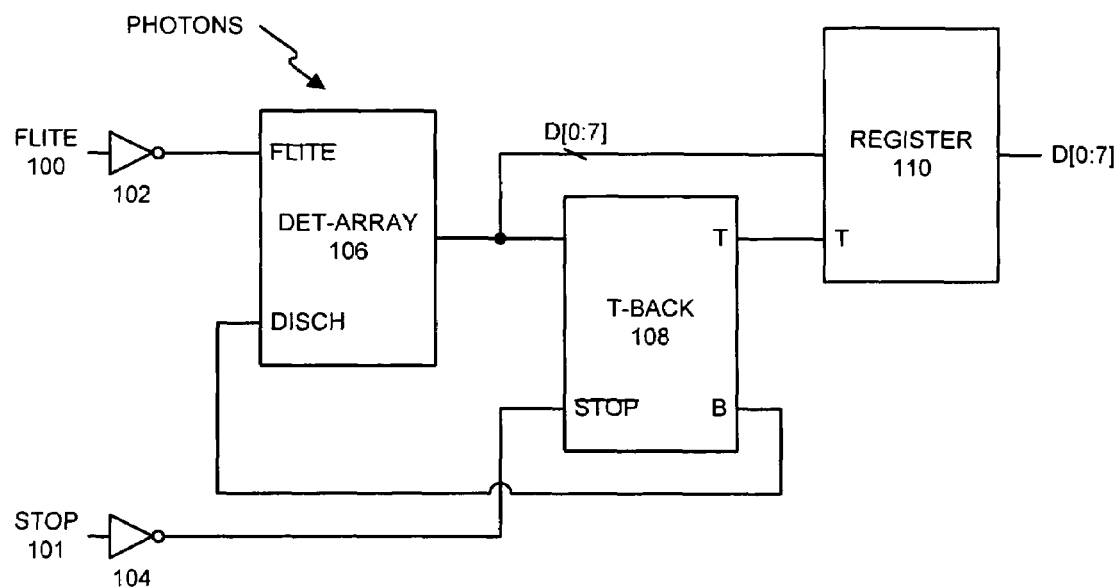
FIG. 1 presents a circuit diagram illustrating a light detection system in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Background

Using light to align two objects is not a new concept. Well-recognized methods include aligning two objects using photo-resistive changes or photo-generated current. However, using photo-alignment to align two silicon chips is new. Given advancements in microprocessor design technology, one embodiment of the present invention uses a standard CMOS process to produce a light emitting and light detection system to align multiple semiconductor dies. In doing so, the challenge is to produce a light emitter and a light receiver within the constraints of a standard CMOS process flow.

In one embodiment of the present invention, a light emitter is constructed out of a P+/N+ junction. Applying a positive voltage to the cathode breaks down the junction and creates light. The forced reverse bias current transfers energy to the electrons of the silicon atoms. The electrons emit light when returning to lower energy states. This light can then be collimated; although the beam narrowness is limited by diffraction. Light generated by a semiconductor laser improves this but violates the process simplicity goal. Forming the emitter junction is problematic because CMOS active areas are areas shorted by the metal silicide process. Adjacent P/N areas without deletion of silicide will short the P/N junction.

Receivers for typical data transmission are well known. The receivers, or photo detectors, detect changes in the power of the light beam. The goal of photo-detectors when used for communications is high speed data transmission. However, currently for chip to chip alignment, a human is part of the action between movement and measurement. Human reaction times are in the hundreds of milliseconds while speeds in silicon are in nanoseconds. Thus, major parts of the detector can be very slow.

The integration of electrons released by photons is proportional to the light intensity. If required, a low rate of photons releasing electrons can be integrated over milliseconds. An integrating detector can be made easily in CMOS by using the transistor gate as a charge storing node.

In one embodiment of the present invention, a light emitting diode (LED) can be used as a transmitter. A Zener diode emitter connected to an N-well series resistor can form an emitter circuit. This N-well resistor prevents current hogging between two or more emitter circuit connected in parallel. At least two emitter networks can be arranged perpendicular to each other forming the X-Y axis and are connected to a common raw pad. The raw pad carries a voltage of six volts or more to turn on the Zener diode emitters.

In one embodiment of the present invention, the receivers are arrayed PMOS transistors whose elongated drains act as reversed biased P/N junctions. These junctions generate electrons by the well-known photo-voltaic process. Each PMOS transistor is at a measured distance from one another. The current flows at each PMOS junction but is highest at the junction with the highest light intensity. This current is integrated at the gate of a displaced charge pre-conditioned NMOS transistor.

To distinguish which PMOS drain junction has the highest light intensity the generated current is integrated and amplified to a logic level by an NMOS amplifier. A large OR gate signals when at least one amplifier has reached a predetermined limit. At this time all the amplified logic levels are latched. After latching, the charge on all the amplifiers is discharged momentarily and the process is repeated. The latched data then can be scanned out digitally or converted to an analog signal and measured.

Light Detection System

FIG. 1 presents a circuit diagram illustrating a light detection asynchronous state machine in accordance with an embodiment of the present invention. The light detection asynchronous state machine has two controls: the "flite" 100, input at inverter 102, and the "stop" 101, input at inverter 104. (Flite stands for "false light.") When flite 100 is asserted, all the detectors in detector array 106 will output PMOS IDs current as if they are receiving strong light. Hence, the flite 100 input can be used to test the overall circuit. When flite 100 is asserted, the circuit oscillates through the asynchronous sequence of discharge, detect and update states. The D[0:7] word stored in register 110 will vary because of time variant transistor mismatch and ambient light variations. When flite 100 is deasserted, the detectors in detector array 106 will output PMOS IDs current when they receive light from an external source. Once a detector is receiving light, T-back circuit 108 causes the light detection asynchronous state machine to update register 110 with the detector that received light, and then resets the detectors in detector array 106. When the stop input 101 is asserted, this halts the feedback signal from continuously discharging the integrating amplifier input node.

Photo Detector Array

Figure 2:
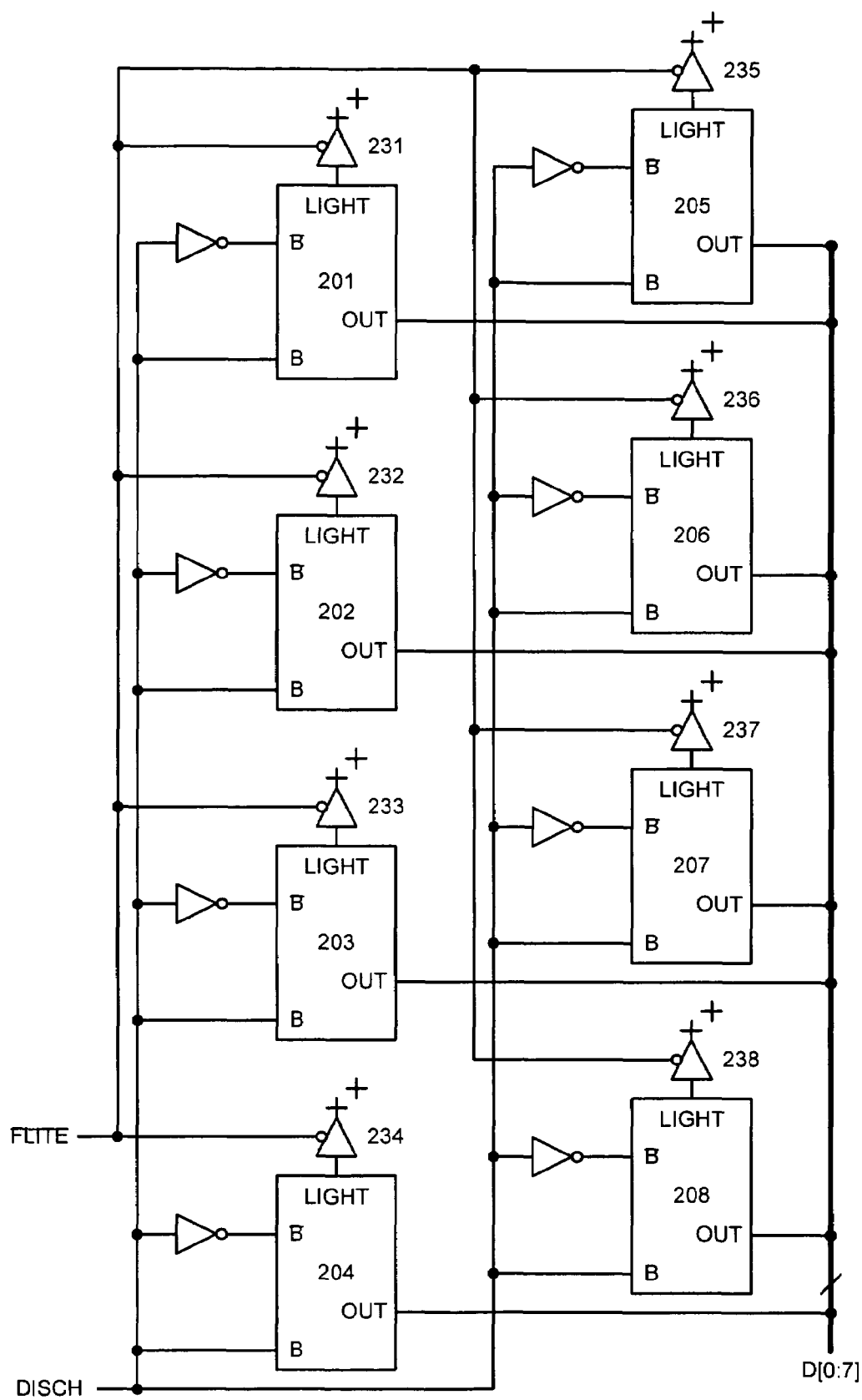
FIG. 2 illustrates a detector array in accordance with an embodiment of the present invention.

FIG. 2 illustrates detector array 106 in accordance with an embodiment of the present invention. As is illustrated in FIG. 2, detector array 106 has eight photo-detector integrating amplifiers 201–208. Each photo-detector integrating amplifier 201–208 has a corresponding integrating transistor and a photo-diode 231–238 for receiving light.

Photo-Diode

Figure 3:
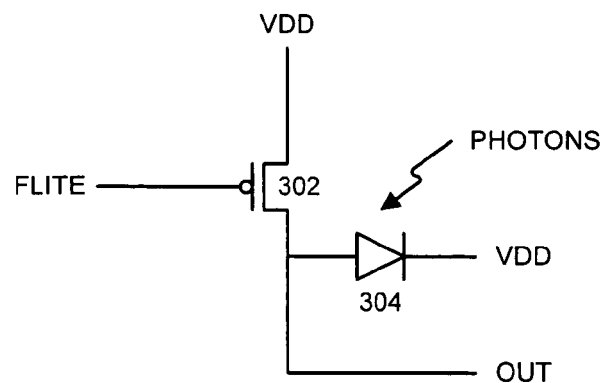
FIG. 3 illustrates a photo-diode and associated circuitry in accordance with an embodiment of the present invention.

FIG. 3 illustrates a photo-diode 304 and associated circuitry in accordance with an embodiment of the present invention. In this layout, the pitch is the minimum allowed by fabrication technology. In the actual layout, the drain of the PMOS transistor 302 is elongated and acts as the P/N-junction photo-voltaic generator.

Integrating Amplifier

Figure 4:
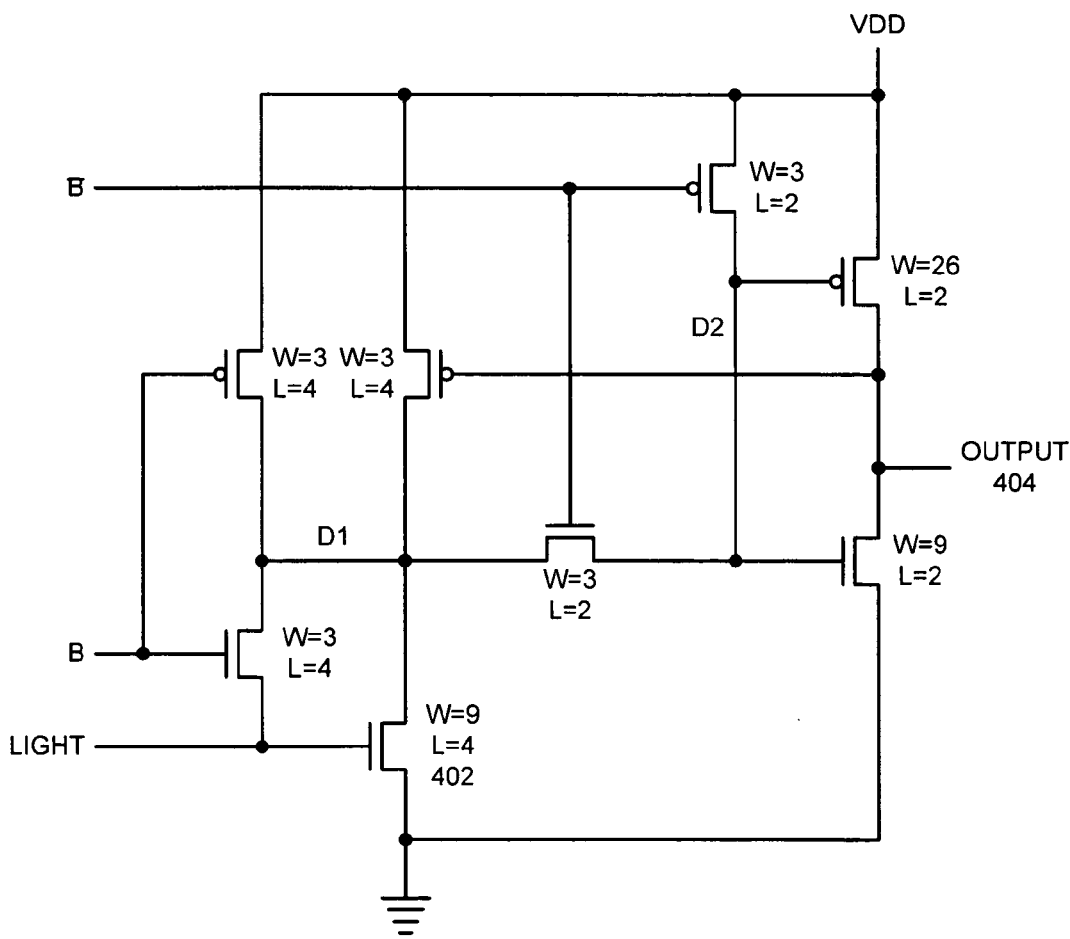
FIG. 4 presents a circuit diagram illustrating an integrating amplifier in accordance with an embodiment of the present invention.

FIG. 4 presents a circuit diagram illustrating an integrating amplifier 201 in accordance with an embodiment of the present invention. Asserting signal B biases the amplifier near the triode/saturation transition. Bringing signal B LO displaces charge on the gate of the primary NMOS transistor 402, thereby setting the amplifier to be incrementally de-biased. At this point the amplifier is in the integrating mode. The final output signal 404 is either logic LO or HI depending on the voltage at node D1.

Semiconductor Die Alignment

In one embodiment of the present invention, the light emitters are Zener diodes. To measure two axes of alignment, a minimum set of two is required, one for X and one for Y. They are connected in parallel and require one raw pin. The test pin exhibits a reverse breakdown curve of a P/N-junction. The break down is in the range of six volts. The actual tester electronics have a provision for a series resistor external to the chips to limit current. Maximum current is limited to 20 milliamperes by using a 210 ohm resister in series with the pin and an external applied voltage of 10 volts.

Initially, the scan path sets flite 100 LO and stop 101 HI to reset the D[0:7] signal. Asserting stop signal 101 LO begins the detection process. After a time of less than 1 millisecond, D[0:7] will be stable and will register one or two bits LO in a field of HI data. These data bits can be then scanned out after stop signal 101 is asserted HI.

Note that a potential for metastability exists because the data can be in transition at assertion "or-out" or the stop signal 101. Noise causes some uncertainty. Hence, the data detection may require several trials to obtain unambiguous data because of metastability and noise.

A test mode begins in the same manner as above with the exception that the flite signal 100 is asserted HI after stop 101 is asserted LO. The array of PMOS transistors that make up the detector array provide current that mimics strong light.

Process of Detecting Light

Figure 5:
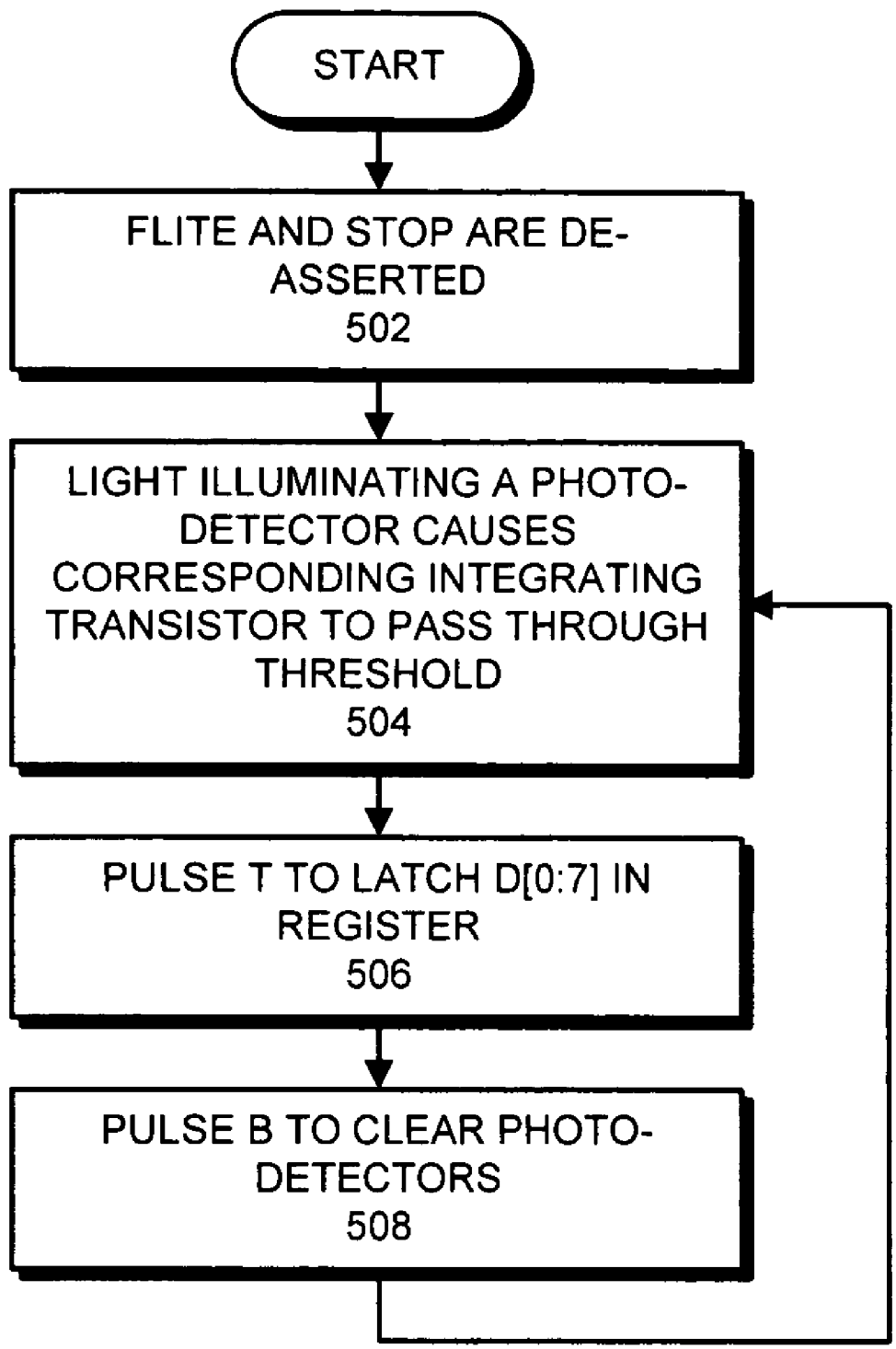
FIG. 5 presents a flowchart illustrating the process of detecting light in accordance with an embodiment of the present invention.

FIG. 5 presents a flowchart illustrating the process of detecting light in accordance with an embodiment of the present invention. The system starts when flite signal 100 and stop signal 101 are de-asserted (step 502). Next, as light illuminates one or more photo-detectors in detector array 106, corresponding integrating transistors in integrating amplifiers 201–208 pass through the threshold state (step 504). At some periodic interval, the system pulses T to latch D[0:7] in register 110 (step 506). Finally, the system pulses B to clear the photo-detectors in detector array 106 and returns to step 504 to repeat the process (step 508).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for detecting light which is incident to a first semiconductor die to facilitate in aligning the first semiconductor die, the method comprising:

biasing a gate voltage of an integrating transistor to be close to a threshold voltage of the integrating transistor;

generating light from a light source located on a second semiconductor die which is in close proximity to the first semiconductor die, so that the light is received at the photo-detector on the first semiconductor die;

receiving the light at a photo-detector on the first semiconductor die, wherein the photo-detector converts the received light into a current;

applying the current to the gate of the integrating transistor so that the current causes a charge to collect at the gate of the integrating transistor, which eventually causes the integrating transistor to switch, thereby indicating that light has been received by the photo-detector on the first semiconductor die;

receiving light at a second photo-detector on the first semiconductor die, wherein the second photo-detector is part of an array of photo-detectors on the first semiconductor die;

applying the current from the second photo-detector to a corresponding integrating transistor in a corresponding array of integrating transistors; and determining an alignment of the first semiconductor die relative to the second semiconductor die based upon which photo-detectors in the array of photo-detectors received the light, wherein the alignment is to a precision that would allow capacitive communication between the first semiconductor die and the second semiconductor die.

2. The method of claim 1, wherein the integrating transistor switching causes a detector output to switch;

wherein the method further involves storing detector outputs from the array of integrating transistors into an output register;

wherein the output register indicates which photo-detectors in the array of photo-detectors received light.

3. The method of claim 1, wherein the photo-detector includes:

a photo-diode; or a P/N-junction photo-detector.

4. The method of claim 1, wherein the light is generated by one of:

a Zener diode;

a light emitting diode (LED);

a vertical cavity surface emitting laser (VCSEL); and an avalanche breakdown P/N diode.

5. An apparatus for detecting light which is incident to a first semiconductor die to facilitate in aligning the first semiconductor die, comprising:

a biasing mechanism configured to bias a gate voltage of an integrating transistor to be close to a threshold voltage of the integrating transistor;

a light-generating mechanism configured to generate light from a light source located on a second semiconductor die which is in close proximity to the first semiconductor die, so that the light is received at the photo-detector on the first semiconductor die;

a receiving mechanism configured to receive the light at a photo-detector on the first semiconductor die, wherein the photo-detector converts the received light into a current;

wherein the receiving mechanism is configured to apply the current to the gate of the integrating transistor, so that the current causes a charge to collect at the gate of the integrating transistor, which eventually causes the integrating transistor to switch, thereby indicating that light has been received by the photo-detector on the first semiconductor die;

a second receiving mechanism configured to receive light at a second photo-detector on the first semiconductor die, wherein the second photo-detector is part of an array of photo-detectors on the first semiconductor die;

wherein the second receiving mechanism is configured to apply the current from the second photo-detector to a corresponding integrating transistor in a corresponding array of integrating transistors; and an alignment mechanism configured to determine an alignment of the first semiconductor die relative to the second semiconductor die based upon which photo-detectors in the array of photo-detectors received the light, wherein the alignment is to a precision that would allow capacitive communication between the first semiconductor die and the second semiconductor die.

6. The apparatus of claim 5, wherein the integrating transistor switching causes a detector output to switch;

wherein the apparatus further comprises an output register configured to store detector outputs from the array of integrating transistors;

wherein the output register indicates which photo-detectors in the array of photo-detectors received light.

7. The apparatus of claim 5, wherein the photo-detector includes:
- a photo-diode; and
- a P/N-junction photo-detector.

8. The apparatus of claim 5, wherein the light is generated by one of:
- a Zener diode;
- a light emitting diode (LED);
- a vertical cavity surface emitting laser (VCSEL); and
- an avalanche breakdown P/N diode.

9. A computer system including a mechanism for aligning a first semiconductor die based on light incident to the first semiconductor die, comprising:
- a processor;
- a memory;
- the first semiconductor die comprising at least one of the processor and the memory;
- a biasing mechanism on the first semiconductor die configured to bias a gate voltage of an integrating transistor to be close to a threshold voltage of the integrating transistor;
- a light-generating mechanism configured to generate light from a light source located on a second semiconductor die which is in close proximity to the first semiconductor die, so that the light is received at the photo-detector on the first semiconductor die;
- a receiving mechanism configured to receive the light at a photo-detector on the first semiconductor die, wherein the photo-detector converts the received light into a current
- wherein the receiving mechanism is configured to apply the current to the gate of the integrating transistor, so that the current causes a charge to collect at the gate of the integrating transistor, which eventually causes the integrating transistor to switch, thereby indicating that light has been received by the photo-detector on the first semiconductor die;
- a second receiving mechanism configured to receive light at a second photo-detector on the first semiconductor die, wherein the second photo-detector is part of an array of photo-detectors on the first semiconductor die;
- wherein the second receiving mechanism is configured to apply the current from the second photo-detector to a corresponding integrating transistor in a corresponding array of integrating transistors; and
- an alignment mechanism configured to determine an alignment of the first semiconductor die relative to the second semiconductor die based upon which photo-detectors in the array of photo-detectors received the light, wherein the alignment is to a precision that would allow capacitive communication between the first semiconductor die and the second semiconductor die.

10. The computer system of claim 9,
- wherein the integrating transistor switching causes a detector output to switch;
- wherein the apparatus further comprises an output register configured to store detector outputs from the array of integrating transistors;
- wherein the output register indicates which photo-detectors in the array of photo-detectors received light.

11. The computer system of claim 9, wherein the photo-detector includes:
- a photo-diode; and
- a P/N-junction photo-detector.

12. The computer system of claim 9, wherein the light is generated by one of:
- a Zener diode;
- a light emitting diode (LED);
- a vertical cavity surface emitting laser (VCSEL); and
- an avalanche breakdown P/N diode.

\* \* \* \* \*